United States Patent
Chitica et al.

(10) Patent No.: US 6,555,407 B1
(45) Date of Patent: Apr. 29, 2003

(54) METHOD FOR THE CONTROLLED OXIDATION OF MATERIALS

(75) Inventors: Nicolae Pantazi Chitica, Jaralla (SE); Fredrik Salomonsson, Stockholm (SE); Anita Risberg, Stockholm (SE)

(73) Assignee: Zarlink Semiconductor AB, Jarfalla (SE)

( * ) Notice: Subject to any disclaimer, the term of this patent is extended or adjusted under 35 U.S.C. 154(b) by 0 days.

(21) Appl. No.: 09/693,233

(22) Filed: Oct. 20, 2000

Related U.S. Application Data

(60) Provisional application No. 60/169,732, filed on Dec. 8, 1999.

(30) Foreign Application Priority Data

Oct. 26, 1999 (GB) ............................................. 9925176

(51) Int. Cl.[7] ............................................. H01L 21/00
(52) U.S. Cl. ............................. 438/24; 438/36; 438/38; 438/46
(58) Field of Search ........................ 438/22–46; 372/45, 372/46

(56) References Cited

U.S. PATENT DOCUMENTS

| | | | |
|---|---|---|---|
| 2,901,325 A | | 8/1959 | Theuerer |
| 3,939,293 A | | 2/1976 | Brusic et al. |
| 4,505,028 A | | 3/1985 | Kobayashi et al. |
| 4,857,480 A | | 8/1989 | Plante |
| 5,550,081 A | * | 8/1996 | Holonayak et al. ........... 438/22 |
| 5,568,499 A | | 10/1996 | Lear |
| 5,633,527 A | | 5/1997 | Lear |
| 5,920,586 A | * | 7/1999 | Nagai .......................... 372/46 |
| 5,959,329 A | | 9/1999 | Tomita et al. |
| 5,972,731 A | * | 10/1999 | Dutta ........................... 438/39 |
| 5,985,683 A | * | 11/1999 | Jewell ......................... 438/22 |
| 6,026,108 A | * | 2/2000 | Lim et al. ..................... 372/50 |
| 6,195,380 B1 | * | 2/2001 | Shih et al. .................... 372/96 |
| 6,287,884 B1 | * | 9/2001 | Jie et al. ....................... 438/39 |

FOREIGN PATENT DOCUMENTS

| | | |
|---|---|---|
| EP | 0 858 137 A2 | 12/1998 |
| GB | 809644 | 2/1959 |
| GB | 2 295 271 A | 5/1996 |
| JP | 01155686 | 6/1989 |
| JP | 07094716 | 4/1995 |
| JP | 08031813 | 2/1996 |
| JP | 2000114253 | 4/2000 |
| WO | WO 99/03141 | 1/1999 |

OTHER PUBLICATIONS

Ochaiai et al "Kinetics of thermal oxidation of AlAs in water vapor" App. Phys. Letts 68(14) Apr. 1, 1996.*

Holmes et al "High effectivity visible wavelength semcionductor native oxide Bragg reflectance grown by MOCVD" Appl. Phys. Letts 66(21) May 22, 1995.*

Feld et al "In situoptical monitoring of aIAs wet oxidation using a novel low temperature low pressure steam funace" IEEE Technology letts. vol. 10, Feb. 2, 1998.*

Choe et al"Lateral oxidation of AlAs alyers at elevated water vapor pressure using closed cahmber system" Semiondcutor science and techhnology 15(2000).*

Oplila et al, "Variattion of oxidation rate of silicon carbide with water vapor pressure, Jounal of American Ceramic Society" Mar. 1999 vol. 82, No. 3, pp 625–36 (Abstract only, available).*

* cited by examiner

*Primary Examiner*—Savitri Mulpuri
(74) *Attorney, Agent, or Firm*—Lawrence E. Laubscher, Jr.

(57) ABSTRACT

A method of carrying out the controlled oxidation of A material, such as Al(Ga)As is oxidized in a controlled manner placing it in a reactor, and causing a carrier gas containing an oxidizing vapour, such as water, at a controlled partial pressure to flow over the oxidizable Material. In this way, the reaction process can be made sensitive to only one variable.

10 Claims, 4 Drawing Sheets

400 °C
8 mbar
30 min

440 °C
22 mbar
8 min

440 °C
22 mbar
15 min

480 °C
22 mbar
15 min

METHOD FOR THE CONTROLLED OXIDIATION OF MATERIALS

CROSS REFERENCE TO RELATED APPLICATION

This application claims priority under 35 USC 119(e) from U.S. provisional application No. 60/169,732 filed on Dec. 8, 1999.

SUMMARY OF THE INVENTION

This invention relates to a method and apparatus for the controlled oxidation of materials, such as Al(Ga)As alloys.

BACKGROUND OF THE INVENTION

In the optoelectronics industry, for example in the manufacture of LEDs and VCSELs (Vertical Cavity Surface Emitting Lasers), there is a need to effect the controlled conversion of Al(Ga)As to $AlO_x$ in order to fabricate current or optical apertures. The oxidation process for converting Al(Ga)As to $AlO_x$ is dependent on the kinetics of the oxidation reaction, supply of reactant (oxygen containing species) and removal of the by-products of the conversion reaction (e.g As). Unfortunately, this makes the Al(Ga)As->$AlO_x$ conversion process very sensitive to factors such as temperature of the sample, composition of the Al(Ga)As material, the thickness of the layer, surface treatment prior to oxidation, amount of moisture in the reactive atmosphere of the furnace, exposure to air prior to the oxidation process, and opening/closing mode of the furnace when the sample is loaded. While some of these factors, such as temperature, can be relatively easily, others are very difficult if not impossible to control accurately enough (e.g. exposure to air, loading mode) and are generally considered "noise factors". The many investigations on various Al(Ga)As oxidation processes that have been carried out by different researchers indicate a large variability in the process, suggesting a large contribution by the noise factors. This makes it difficult to control the conversion process with sufficient precision, resulting in a degradation of the device performance and an inability to produce higher speed devices.

An object of the invention is to alleviate this disadvantage.

SUMMARY OF THE INVENTION

According to the present invention there is provided a method of carrying out the controlled oxidation of an oxidisable material, comprising the steps of placing the oxidisable material into a reactor, and causing a carrier gas to flow over said oxidisable material, said carrier gas containing an oxidising vapour at a controlled partial pressure.

The oxidising vapour is typically water vapour and the carrier gas, and inert gas, typically nitrogen, in which case the partial pressure of the water vapour can be controlled by controlling the temperature of a water bath, in turn to accurately control the oxidation process.

The oxidation process is typically carried out in a reactor tube at temperatures in the range of 400–500° C. and pressures in the range of 50–100 mbar. These ranges are typical and not limiting. Precise control of the oxidation rate and of the final oxide thickness is achieved by controlling the partial pressure of the water vapor in the furnace tube.

The invention can be applied, for example, to the oxidation of Al(Ga)As in the manufacture of high speed VCSELs.

The process in accordance with the invention reduces the noise factors present when Al(Ga)As is converted $AlO_x$. The oxidation process is designed so that rate depends mainly on one control factor, namely the partial pressure of the oxidising vapour or the time of exposure.

The time of exposure can be controlled in practice by removing the sample from the oven or just turning off the water vapour.

Using the method of the invention, it has surprisingly been found that the reaction parameters can be chosen so that the oxidation process is tolerant to variations in temperature and total pressure in the furnace, to variations in the composition and thickness of the Al-containing layers or to the preparation of the samples.

While primarily intended for Al-containing layers, such as Al(Ga)As, the invention can be applied to other materials that need to be oxidised in a highly controlled manner.

Typically, the reaction is carried out at a low pressure, for example, 50–100 mbar at temperatures in the range 400–500° C. These parameters are purely exemplary and not limiting. Persons skilled in the art can determine the optimum parameters for any particular application by routine experiment.

The invention also provides an apparatus for carrying out the controlled oxidation of an oxidisable material, comprising a reactor for containing the oxidisable material, a supply of carrier gas for flowing over said oxidisable material, and a supply of oxidising vapour, and a mixing device for mixing said oxidising vapour with carrier gas at a controlled partial pressure.

The apparatus and process parameters presented here provide for the precisely controlled oxidation of layered semiconductor structures including at least one layer of Al containing alloy. As a particular case, an isotropic oxidation rate can achieved for an AlAs alloy without addition of Ga.

DESCRIPTION OF THE DRAWINGS

The invention will now be described in more detail, by way of example only, with reference to the accompanying drawings, in which.

DETAILED DESCRIPTION OF THE PREFERRED EMBODIMENTS

Figure 1:
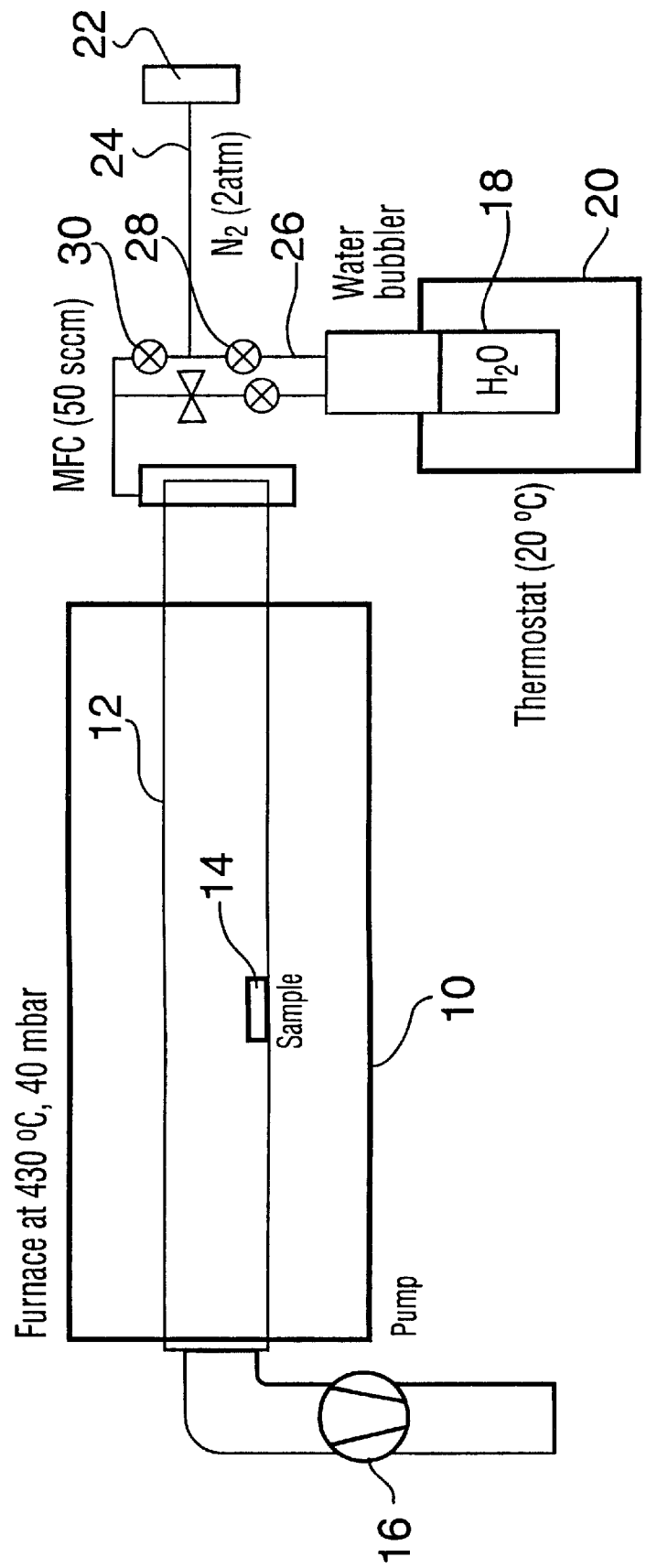
FIG. 1 shows an apparatus for carrying out the invention.

An apparatus for carrying out the novel method is shown in FIG. 1. A furnace 10 with reactor tube 12 contains a sample to be oxidised, for example, a VCSEL precursor having an Al(Ga)As layer, which needs to be oxidised to form an optical aperture.

The furnace 10 heats the reactor tube to a temperature of 430° C. and pump 16 evacuates it to a pressure of 40 mbar.

A water bath 18 is heated to a temperature of 20° C. by thermostatically controlled heater 20 to produce a controlled supply of water vapour. A source 22 supplies nitrogen at two atmospheres to supply line 24 where it is mixed with water vapour flowing along line 26 from the water bath 18. Valves 28 and 30 enable the flow rate of the water vapour and combined gases to be controlled. In this example, the flow rate is 50 sccm.

The partial pressure of the water vapor is controlled by controlling the temperature of the water bath 18. The temperature of the reservoir is typically set in the range of 0–20° C., but it is not limited to this.

The design of the apparatus ensures that the partial pressure of the water vapor in the furnace is accurately maintained at the desired value and that it can be changed in a short time from zero to the desired working value ("on") and also from this value to a much lower, near-zero value ("off").

The oxidation time is accurately set by switching "on" and "off" the water vapor as the oxidation rate is negligible in the "off" state. The parameters are chosen such that the oxidation process is tolerant to variations in temperature and total pressure in the furnace, to variations in the composition and thickness of the Al-containing layers or to the preparation of the samples. Good reproducibility of the oxide thickness has been achieved with various samples over a time span of several months.

It will thus be seen in accordance with the principles of the invention that the reaction rate is directly controlled by the partial pressure of the water vapor fed into the reactor (furnace tube). The partial pressure of the water vapor is accurately set and maintained through the temperature of a water bath. This control is facilitated by having the reservoir in a thermostat bath at a near ambient temperature.

The design and construction of the water bath and of the lines feeding the gas mixture to the reactor provide for the accuracy of the control over the partial pressure of the water vapors in the reactor. The design relies on a fundamental physical law that states that at equilibrium the partial pressure of the water vapor is uniquely defined by the temperature of the vapor/liquid system to control the process.

The apparatus provides a means for effectively switching on and off the water vapor. When switched "on", the partial pressure of the vapor in the furnace tube will settle in a short time to the desired working value. When switched to "off" the partial pressure will be reduced to a near-zero value and only carrier gas only will flow through the furnace tube. This provides the way to define the oxidation time.

By conducting the reaction at a low pressure (50–100 mbar range), good control can be ensures over residual gases enabling effective contaminant control.

The apparatus also has the advantage of low gas flows and easy-to-handle exhausts.

Figure 2:
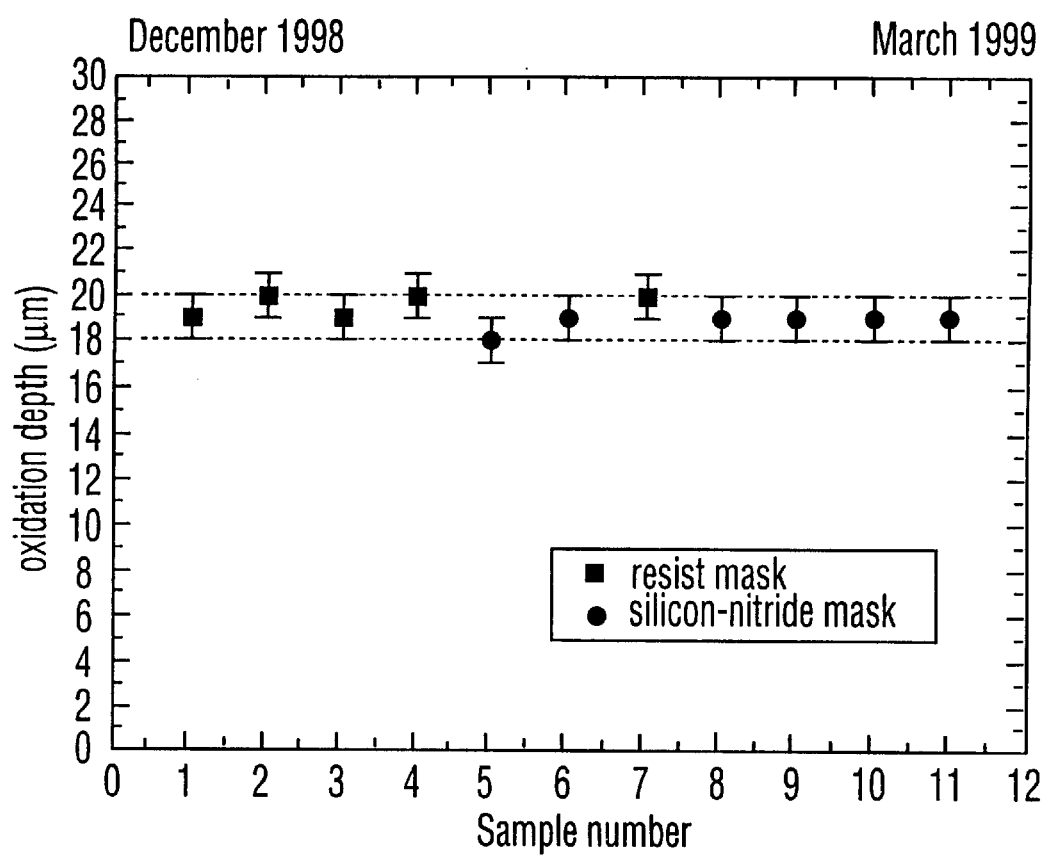
FIG. 2 shows the reproducibility of the oxidation depth for various samples oxidised in accordance with the principles of the invention over a span of three months.

FIG. 2 shows a series of samples taken over a period of three months. The square points are for a resist mask and the round points are for a silicon nitride mask. It will be seen that between December 1998 and March 1999, it was possible to maintain the oxidation depth between 18 and 20 µm.

Figure 3:
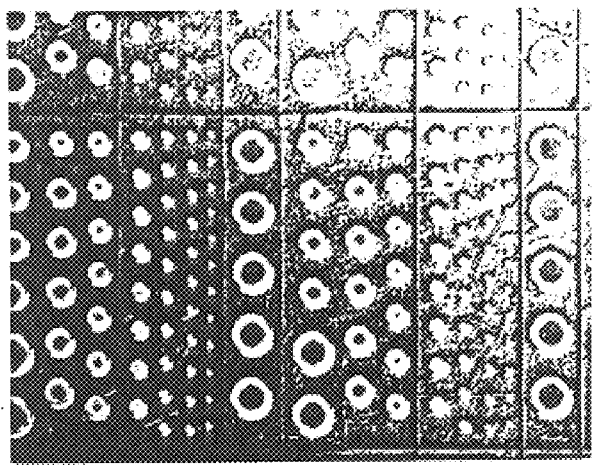
FIG. 3 shows the uniformity of oxidation depth for mesas with various diameters and at different locations over the chip.

FIG. 3 illustrates the uniformity of oxidation depth for mesas with various diameters and different locations over the chip. This represents a significant improvement.

Figure 4:
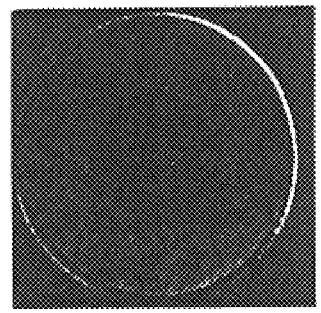
FIG. 4 shows typical aspects of the oxide aperture.
Figure 4:
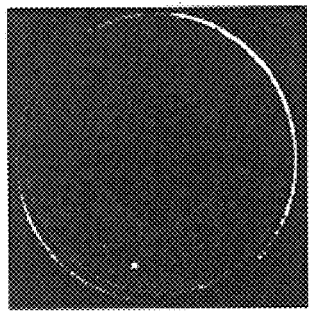
Figure 4:
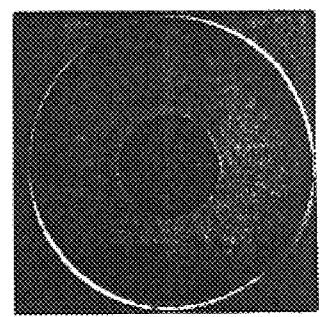
Figure 4:
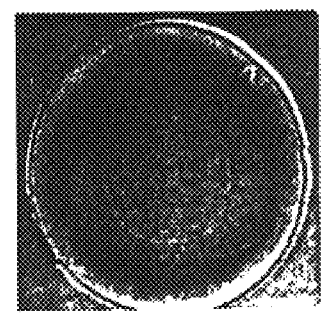

FIG. 4 illustrates how both circular and rectangular windows can be formed with the invention. The circular shape results from an isotropic rate wherein the oxidation front copies the shape of the mesa, and the rectangular shape results from an anisotropic oxidation rate. The conditions for the various samples shown in FIG. 4 were: 440° C. at a partial pressure of 22 mbar for 8 mins., 400° C. at a partial pressure of 8 mbar for 30 mins., 440° C. at a partial pressure of 22 mbar for 15 mins., and 480° C. at a partial pressure of 22 mbar for 15 mins.

Figure 5A:
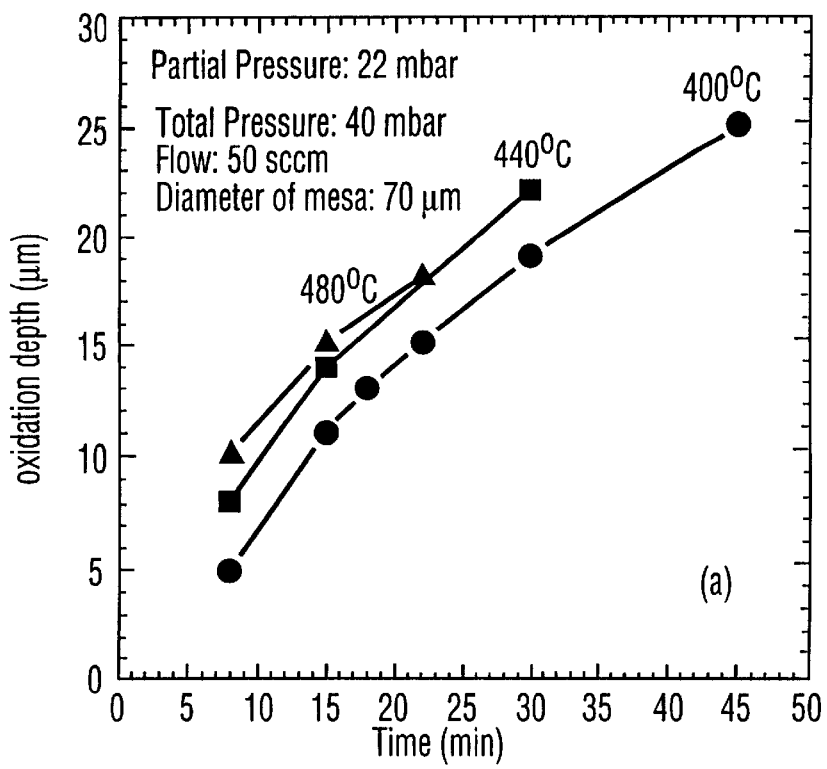
FIG. 5a shows the dependence of oxidation depth on time for various furnace temperatures.
Figure 5B:
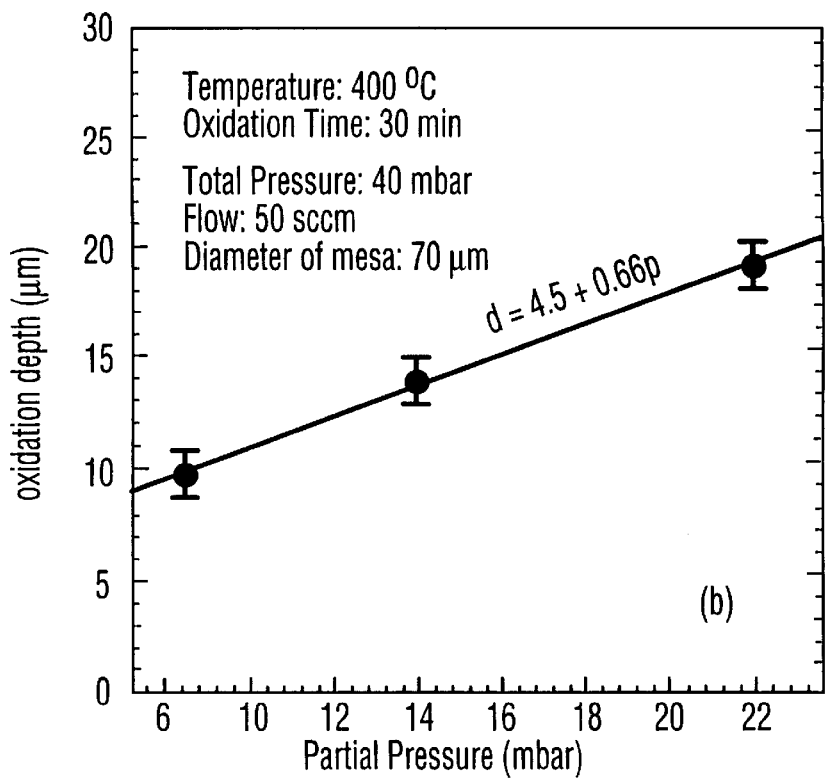
FIG. 5b shows the dependence of the oxidation depth on partial pressure of water vapors for a temperature of the furnace of 400° C. and a time of 30 minutes.

FIG. 5a shows the dependence of oxidation depth on time for various furnace temperatures. FIG. 5b shows the dependence of the oxidation depth on the partial pressure of water vapour for a furnace temperature of 400° C. and an exposure time of 30 mins.

In all cases, the oxidation depth is determined almost solely by the partial pressure of the water vapour and the exposure time. Unlike the prior art, in accordance with the principles of the invention the variables can be selected so that the noise parameters have very little impact on the oxidation process.

In summary, the process according to the principles of the invention offers easily controllable process parameters and oxidation time, very good reproducibility and stability, good uniformity, an isotropic rate without using ternary alloys, and is tolerant to sample preparation.

Although water vapour has been described as the oxidising vapour, the invention could also work with other oxidising vapours.

We claim:

1. A method of carrying out the controlled oxidation of an Al-containing compound semiconductor oxidizable material, comprising the steps of placing the oxidizable material in a reactor, causing a carrier gas to flow over said oxidizable material, said carrier gas containing an oxidizing vapor at a controlled partial pressure, said oxidizing vapor being generated in a thermostatically controlled bath and wherein the oxidizing vapor is maintained in equilibrium with water in the bath and controlling said partial pressure to determine the oxidation rate of said oxidizable material.

2. A method as claimed in claim 1, wherein the flow of said oxidizing vapor is cut off after a predetermined time while maintaining flow of said carrier gas.

3. A method as claimed in claim 1, wherein said carrier gas is nitrogen.

4. A method as claimed in claim 1, wherein said oxidizing vapor is water.

5. A method as claimed in claim 1, wherein the temperature of said bath is controlled to control the partial pressure of said oxidizing vapor and thus the oxidation process.

6. A method as claimed in claim 1, wherein said reactor is provided inside a furnace maintained a target temperature.

7. A method as claimed in claim 6, wherein said target temperature is about 400–500° C.

8. A method as claimed in claim 1, wherein said reactor is maintained at a pressure of about 50–100 mbar.

9. A method as claimed in claim 1, wherein said oxidizable material is Al(Ga)As.

10. A method as claimed in claim 1, used in the manufacture of a VCSEL or LED.

* * * * *